United States Patent

[11] 3,622,913

[72] Inventor Don Glen Shipley
Princeton Jct., N.J.
[21] Appl. No. 872,185
[22] Filed Oct. 29, 1969
[45] Patented Nov. 23, 1971
[73] Assignee RCA Corporation

[54] FREQUENCY MODULATED PHASE-LOCKED OSCILLATOR HAVING A LOW- AND HIGH-FREQUENCY RESPONSE
8 Claims, 1 Drawing Fig.

[52] U.S. Cl. .......... 332/16, 325/148, 325/419, 331/18, 331/23, 332/19
[51] Int. Cl. .......... H03c 3/08
[50] Field of Search .......... 332/16, 16 T, 19; 331/18, 23, 25–29, 55; 325/148, 184, 419

[56] References Cited
UNITED STATES PATENTS

| | | | |
|---|---|---|---|
| 2,773,241 | 12/1956 | Hugenholtz | 332/19 |
| 3,176,246 | 3/1965 | Boiten | 331/23 X |
| 3,393,380 | 7/1968 | Webb | 332/19 |
| 3,480,883 | 11/1969 | Gaunt | 332/19 |

*Primary Examiner*—Alfred L. Brody
*Attorney*—Edward J. Norton

ABSTRACT: In a phase-locked loop frequency modulator, the signal applied to the reference input of the phase comparator is a frequency-modulated signal, modulated at the same rate as the output signal, for low-modulating frequencies. For higher modulating frequencies, the signal applied to the reference input of the phase comparator is a constant frequency source.

PATENTED NOV 23 1971 3,622,913
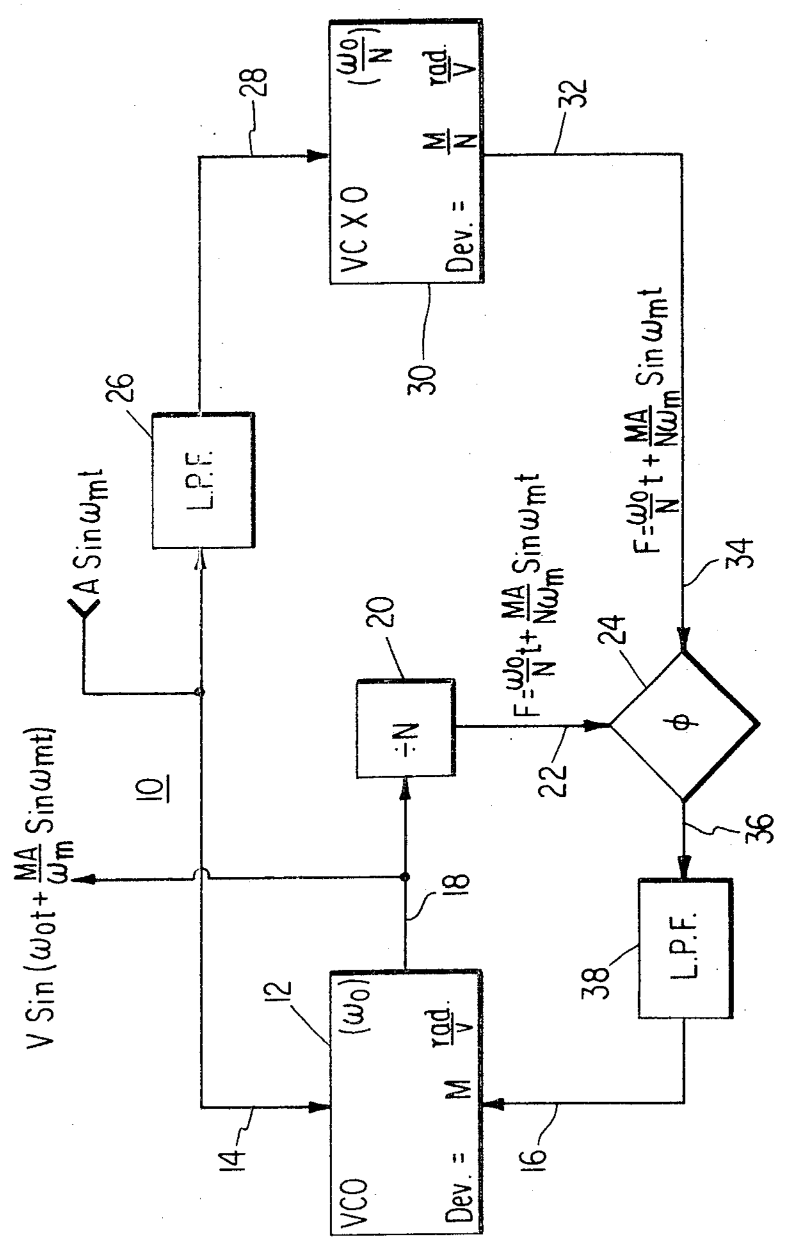
INVENTOR
Don G. Shipley
BY Harry W. Barron
ATTORNEY

FREQUENCY MODULATED PHASE-LOCKED OSCILLATOR HAVING A LOW- AND HIGH-FREQUENCY RESPONSE

This invention relates to frequency modulation and more particular to a frequency-modulating system utilizing a phase-locked loop correction scheme in which modulation may be accomplished at low as well as high frequency.

In the prior art, phase-locked look frequency-modulating schemes are known. In one such scheme, modulating voltage is applied to a voltage-controlled oscillator and this oscillator in turn provides a signal which is frequency modulated. The frequency-modulated signal is frequency divided by an integer number N and applied to one input of a phase-comparing circuit. A reference signal having a stable constant reference frequency equal to the oscillator natural or unmodulated frequency divided by N is applied to a second input of the phase-comparing circuit. Such a signal may be generated by a crystal oscillator. As long as the voltage-controlled oscillator does not drift from its natural frequency, the output of the phase-comparing circuit is a signal having a direct current (DC) component related to the relative phase difference between the natural frequency portion of the voltage-controlled oscillator and the reference signal and an alternating current AC component having a frequency equal to the modulating frequency. This signal is passed through a low-pass filter which eliminates any AC component which is above the high-frequency point of the filter and the resulting signal is applied to the oscillator input. If the voltage-controlled oscillator natural frequency drifts, the DC signal at the output of the low-pass filter changes in a manner to return the oscillator to its natural frequency.

The problem with the system just described is that the modulating frequency must be greater than the high-frequency point of the low-pass filter or the AC portion of the phase-comparing circuit output signal will be passed by the filter. If this occurs, the modulating and phase-comparing signals will cancel each other and thus the frequency-modulating action of the voltage-controlled oscillator will not occur. However, in many applications one desires to be able to frequency modulate with very low frequency or even DC modulating signals, such as in a television transmitter where one desires to transmit an all black or all white portion of a picture. But this cannot be done with the prior art system.

One solution to this problem would be to make the low-pass filter pass only DC, but this is impractical because it would greatly increase the response time of the loop.

In accordance with an embodiment of this invention there is provided first and second controlled oscillators each of which is responsive to the modulating signal such that they provide at an output thereof a signal having an instantaneous frequency dependent on the then existing amplitude of the modulating signal. There is also provided a comparing circuit to which each of the oscillator output signals are applied. The output of the comparing circuit is dependent upon differences in the output of the first oscillator and the output of the second oscillator other than in a fixed relationship. The comparing circuit output is applied back to the first oscillator to correct for any difference in this fixed relationship.

This invention is better understood when reference is made to the single drawing in which one embodiment of the invention is shown.

Frequency modulator 10 includes a voltage-controlled oscillator 12 of known design which oscillates at a predetermined unmodulated carrier frequency $\omega_0$, such as 490 MHz. Oscillator 12 has two inputs, one being a modulating input 14 to which a modulating voltage is applied and the other being a control input 16 to which a control voltage is applied. The frequency at the output 18 of oscillator 12 is dependent upon the value of the voltages applied to modulating input 14 and control input 16. Oscillator 12 is designed to have a frequency deviation sensitivity equal to a selected constant value of M radians per volt.

If a modulating signal of A sin $\omega_m t$ is applied to modulating input 14 of oscillator 12 and the carrier frequency of oscillator 12 is $\omega_0$, the signal at output 18 of oscillator 12 can be given as $$V \sin \left(\omega_0 t + \frac{MA}{\omega_m} \sin \omega_m t\right)$$

where A and V are constants, M is the frequency deviation of oscillator 12, $\omega_0$ is the carrier frequency and $\omega_m$ is the modulating frequency. As is well known, this is the equation for a frequency modulated signal.

The output of oscillator 12 is applied through N frequency dividing network 20 to one input 22 of phase comparing circuit 24. Network 20 divides the signal applied to it by some integer number, for instance 7, and applies a chain of pulses to input 22 which has a $$\text{frequency equal to } \frac{\omega_0}{Nt} + \frac{MA}{N\omega_m} \sin \omega_m t.$$

The modulating signal is also applied through low-pass filter 26 to a modulating input 28 of voltage control crystal oscillator 30. Oscillator 30 is designed to provide a chain of pulses having a natural frequency of $\omega_0$/N when the voltage at input 28 is zero. This occurs when the frequency of the modulating signal, $\omega_m$, is too high to be passed by filter 26. In this situation, the output of oscillator 30 is as stable as a crystal oscillator. Oscillator 30 is further designed to have a frequency deviation sensitivity of M/N radians per volt for situations where a voltage is applied to input 28 thereof. Thus, where the frequency of the modulating signal $\omega_m$ is low enough to be passed by filter 26, the output 32 of oscillator 30 will be a chain of pulses having a $$\text{frequency equal to } \frac{\omega_0}{Nt} + \frac{MA}{N\omega_m} \sin \omega_m t.$$

Output 32 from oscillator 30 is coupled to a second input 34 of phase-comparing circuit 24.

Phase-comparing circuit 24 compares changes in the phase difference of the two signals applied to its respective inputs 22 and 34 from one cycle to the next and applies a voltage to an output 36 which is proportional to this phase difference. The output 36 of phase-comparing circuit 24 is applied through low-pass filter 38 to control input 16 of oscillator 12. Where the natural frequency of the signal applied to input 22 of phase-comparing circuit 24 is equal to the natural frequency of the signal applied to input 34 thereof, the system is said to be phase locked. In this situation, the DC component of the voltage appearing at the output 36 of phase-comparing circuit 24 does not change from cycle to cycle.

Low-pass filters 26 and 38 should have high-frequency points which are nearly equal, although in some situations it may be desirable that the high-frequency point of filter 26 is slightly higher than that of filter 38 to insure the fact the AC voltage component at the output of phase-comparing circuit 24 does not pass through filter 38. Such a high-frequency point could be in the order of 100 Hz.

Circuit 10 differs from the prior art system in that the single crystal oscillator is replaced by filter 26 and voltage-controlled crystal oscillator 30. When the frequency of the modulating signal $\omega_m$ is above the high-frequency point of filters 26 and 38 the operation of circuit 10 resembles the prior art. In this situation, filter 26 blocks the modulation and thus oscillator 30 acts as an unmodulated crystal oscillator. Thus, circuit 10 will have crystal oscillator stability.

The input signals to phase-comparing circuit 24 in this situation are pulse chains having respective $$\text{frequencies equal to } \frac{\omega_0}{Nt} + \frac{MA}{N\omega_m} \sin \omega_m t$$

at input 22 and ($\omega_0$/N)t at input 34. Thus the signal appearing at output 36 of phase-comparing circuit 24 will be a signal having a variable DC component and an AC component of frequency $\omega_m$. The DC component will vary according to the phase difference of the ($\omega_0$/N)t frequency portion of each of the signals. The amount of this variation is determined by the design of circuit 24 with consideration being given to the frequency deviation sensitivity of oscillator 12. The AC component will be a sine wave of frequency $\omega_m$ and since $\omega_m$ is greater than the high-frequency point of low-pass filter 38, this component is blocked. Therefore, only the DC component is passed by filter 38 and applied to input 16 of oscillator 12.

If the natural frequency $\omega_0$ of oscillator 12 changes, due to, for instance, a loop voltage transient or a temperature change, the DC component of the phase-comparing circuit 24 output signal correspondingly changes in a manner to compensate oscillator 12. The DC component changes because the relative phase difference in the signals applied to inputs 22 and 34 of phase comparing circuit 24 changes from one cycle to another due to the fact the frequencies are no longer equal. This new DC voltage is applied to input 16 of oscillator 12 and with it present, oscillator 12 will be controlled to have a natural frequency of $\omega_0$.

Where the frequency of the modulating signal $\omega_m$ is lower than the high-frequency point of filter 26, the output of oscillator 30 becomes a frequency-modulated signal with a frequency identical to the output of N network 20. When the loop is phase locked the two signals at the inputs of phase comparator 24 will both have $$\text{frequencies of } \frac{\omega_0}{Nt}+\frac{MA}{N\omega_m}\sin \omega_m t$$

and the signal at output 36 of phase comparator 24 will remain constant. Thus in this situation, there is no AC component of the signal at output 36 because both of the signals applied to phase-comparing circuit 24 are frequency modulated at the same rate.

If the natural frequency $\omega_0$ of oscillator 12 varies slightly, the $\omega_0$/N portion of the frequency of the signal applied to input 22 will correspondingly vary and the phase difference which existed from one cycle to another between the respective signals applied to input 22 and input 34 of phase-comparing circuit 24 will also change. In this event the DC voltage at output 36 will change in such a manner as to correct oscillator 12 back to the desired natural frequency $\omega_0$. It should be noted that the ($\omega_0$/N)t portion of the frequency applied at input 34 will be very stable because oscillator 30 is a crystal oscillator.

Thus, with this invention, one may use a phase-locked loop frequency modulator for both high- and low-frequency-modulating signals and still have crystal oscillator frequency accuracy. It should be noted however that oscillator 30 may be replaced by any modulated reference oscillator. In such a case the frequency stability of the phase-locked loop would be determined by the stability of this modulated reference oscillator.

What is claimed is:

1. A phase locked loop frequency modulator comprising:
   - a first controlled oscillator means having a first and a second input and an output, said first oscillator providing at said output thereof in response to signals applied to said inputs thereof a signal having a frequency dependent upon said applied signals;
   - a second controlled oscillator means having an input and an output, said second oscillator providing at said output thereof in response to signals applied to said input thereof a signal having a frequency dependent upon said applied signals;
   - means for applying a modulating signal to said first input of said first oscillator;

- a low-pass filter connected to the input of said second controlled oscillator;
   - means for applying said modulating signal to said low-pass filter;
   - comparing means for comparing said first oscillator output signal with said second oscillator output signal and providing a control signal dependent upon the output signals from said first and second oscillators; and
   - means for coupling said output of said comparing means to said second input of said first oscillator.

2. The invention according to claim 1 wherein said first controlled oscillator means includes a voltage-controlled oscillator and said second controlled oscillator means includes a voltage-controlled crystal oscillator.

3. The invention according to claim 1 wherein said means for applying said comparing means output to said second input of said first oscillator includes a second low-pass filter, the high-frequency point of said second filter being no higher than the high-frequency point of said first mentioned low-pass filter.

4. In combination:
   - a voltage controlled oscillator having two inputs and an output;
   - a second voltage-controlled oscillator having an input and an output;
   - a phase comparing circuit having two inputs and an output;
   - first means for coupling the output of said first voltage-controlled oscillator to one of said phase-comparing circuit inputs;
   - second means for coupling the output of said second voltage-controlled oscillator to the other of said phase-comparing circuit inputs;
   - third means for coupling the output of said phase-comparing circuit through a first low-pass filter to one input of said first voltage-controlled oscillator;
   - fourth means for applying a modulating voltage to the other input of said first voltage-controlled oscillator; and
   - fifth means for applying said modulating voltage through a second low-pass filter to the input of said second voltage-controlled oscillator.

5. The invention according to claim 4 wherein said second voltage-controlled oscillator is a voltage-controlled crystal oscillator.

6. The invention according to claim 4 wherein at any given time said first and second voltage-controlled oscillators each provide at the respective output thereof a signal having a frequency dependent upon the magnitude of said modulating voltage at said given time; and
   - wherein said fourth means includes a frequency-dividing network.

7. The invention according to claim 6, wherein the frequency deviation sensitivity of said first voltage-controlled oscillator and said frequency-dividing network in combination, equal the frequency deviation sensitivity of said second voltage-controlled oscillator.

8. The invention according to claim 7,
   - wherein said second voltage-controlled oscillator is a voltage-controlled crystal oscillator, and
   - wherein the high-frequency point of said second low-pass filter is no higher than the high-frequency point of said first low-pass filter.

* * * * *

UNITED STATES PATENT OFFICE
CERTIFICATE OF CORRECTION

Patent No. 3,622,913 Dated November 23, 1971

Inventor(s) Don Glen Shipley

It is certified that error appears in the above-identified patent and that said Letters Patent are hereby corrected as shown below:

| | |
|---|---|
| Column 1, line 8 | "look" should be -- loop -- |
| Column 2, line 8 | "N" should be -- $\div N$ -- |
| Column 2, lines 13-15 | Equation should read: $\frac{\omega 0}{N} t + \frac{MA}{N\omega_m} \sin \omega_m t$ |
| Column 2, lines 31-33 | Equation should read: $\frac{\omega 0}{N} t + \frac{MA}{N\omega_m} \sin \omega_m t$ |
| Column 2, lines 65-67 | Equation should read: $\frac{\omega 0}{N} t + \frac{MA}{N\omega_m} \sin \omega_m t$ |
| Column 3, line 19 | "N" should be -- $\div N$ -- |
| Column 3, lines 23-25 | Equation should read: $\frac{\omega 0}{N} t + \frac{MA}{N\omega_m} \sin \omega_m t$ |

Signed and sealed this 21st day of November 1972.

(SEAL)
Attest:

EDWARD M.FLETCHER,JR.
Attesting Officer

ROBERT GOTTSCHALK
Commissioner of Patents

USCOMM-DC 60376-P69
☆ U.S. GOVERNMENT PRINTING OFFICE 1969 O—366-334